(12) United States Patent
Yamaguchi et al.

(10) Patent No.: US 6,667,542 B2
(45) Date of Patent: Dec. 23, 2003

(54) ANISOTROPIC CONDUCTIVE FILM-CONTAINING DEVICE

(75) Inventors: Miho Yamaguchi, Ibaraki (JP); Yuji Hotta, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 154 days.

(21) Appl. No.: 09/780,254

(22) Filed: Feb. 9, 2001

(65) Prior Publication Data

US 2001/0013661 A1 Aug. 16, 2001

(30) Foreign Application Priority Data

Feb. 10, 2000 (JP) ........................................ 2000-033550

(51) Int. Cl.$^7$ ............................................ H01L 23/495
(52) U.S. Cl. ........................................ 257/668; 257/780
(58) Field of Search ................................ 257/668, 676, 257/780, 795

(56) References Cited

U.S. PATENT DOCUMENTS

| 6,215,321 B1 | * | 4/2001 | Nakata | 324/754 |
| 6,297,658 B1 | * | 10/2001 | Nakata et al. | 324/765 |
| 6,299,713 B1 | * | 10/2001 | Bejtlich | 156/292 |
| 6,338,195 B1 | * | 1/2002 | Tsukagoshi et al. | 29/830 |

FOREIGN PATENT DOCUMENTS

| JP | 10 97382 | 4/1989 |
| WO | WO 98/07216 | 2/1998 |
| WO | WO 99/48110 | 9/1999 |

* cited by examiner

*Primary Examiner*—Wael Fahmy
*Assistant Examiner*—Hoai Pham
(74) *Attorney, Agent, or Firm*—Leydig, Voit & Mayer, Ltd.

(57) ABSTRACT

A semiconductor device containing a circuit board, an anisotropic conductive film and a semiconductor element electrically connected to the circuit board via the anisotropic conductive film, wherein the anisotropic conductive film contains a film substrate made from an insulating resin and plural conductive paths insulated from each other, which paths are disposed in and through the film substrate in the thickness direction, and wherein a gap is formed between the surface on the circuit board side of the film substrate and the board surface of the circuit board. The connection part between the anisotropic conductive film and the circuit board, as well as the connection part between the anisotropic conductive film and the semiconductor element do not suffer from interface destruction even when the device is used in an environment associated with radical temperature changes. Thus, a semiconductor device having high connection reliability can be obtained.

4 Claims, 3 Drawing Sheets

ANISOTROPIC CONDUCTIVE FILM-CONTAINING DEVICE

TECHNICAL FIELD OF THE INVENTION

The present invention relates to a semiconductor device comprising a semiconductor element connected to a circuit board via an anisotropic conductive film. More particularly, the present invention relates to a semiconductor device capable of maintaining superior conductive property even when used in an environment associated with drastic temperature changes.

BACKGROUND OF THE INVENTION

In general terms, semiconductor elements, such as IC, are formed in great numbers on a wafer and cut into respective chips. These chips are each connected to a circuit board. With an increasing number of ICs formed on a chip, the number of electrodes formed on the chip also increases, which in turn necessitates the shape and arrangement pattern of the electrodes to be finer and more narrow-pitched. From the aspect of a mounting technique, a chip and a circuit board are not connected by a wire (wire bonding) any more but by mating a conductor circuit (terminal) of the circuit board to an electrode part of the chip (e.g., flip chip bonding). Alternatively, a naked chip may be mounted on a substrate (bare chip mounting) in accordance with the connection method.

When mating a conductor circuit of a circuit board to an electrode of a chip as mentioned above, an anisotropic conductive film may be used between the chip and the circuit board. An anisotropic conductive film is anisotropic in terms of conductivity, because it is conductive in the direction penetrating the two sides of a film (direction of film thickness) and insulating in the direction of expansion of the film surface.

As the above-mentioned anisotropic conductive film, WO98/07216 proposes an anisotropic conductive film wherein a film substrate made from an insulating resin comprises plural conductive paths insulated from each other and passing through the substrate in the thickness direction. When this anisotropic conductive film is used, the anisotropic conductive film is inserted between the semiconductor element (chip) and the circuit board and these three members are heated with or without pressurization. As a result, the both surfaces of the film substrate of the anisotropic conductive film, which is made from an adhesive insulating resin, are adhered to the surface of the semiconductor chip and the board surface of the circuit board. The semiconductor element and the circuit board are electrically connected by the conductive path which, from among the plural conductive paths, is located such that the both ends of the path can be each connected to an electrode of the semiconductor element and a conductor circuit (terminal) of the circuit board.

When the above-mentioned semiconductor device, wherein the semiconductor element is electrically connected to the circuit board via the anisotropic conductive film, is used for a long time in an environment associated with radical temperature changes, the conductive property, which was superior at the beginning, may be degraded strikingly during the use. The present inventors have closely investigated the connection state between the semiconductor element and the circuit board of such a semiconductor device, and found that the connection interface (i.e., at least one of the interface of the connection part between the anisotropic conductive film and the circuit board, and the interface of the connection part between the anisotropic conductive film and the semiconductor element) was destroyed.

SUMMARY OF THE INVENTION

It is therefore an object of the present invention to provide a semiconductor device capable of maintaining superior conductive property without destruction of the connection interface even when placed in an environment associated with radical temperature changes.

In accordance with the present invention, the following has been clarified. A conventional semiconductor device has a structure wherein the both surfaces of a film substrate of an anisotropic conductive film are in contact (connected) with the surface of the semiconductor element and the board surface of the circuit board. As a result, the thermal expansion (contraction) of both the semiconductor element and the circuit board acts on the anisotropic conductive film, and a stress due to the difference in the coefficient of linear expansion between the semiconductor element and the circuit board is generated in the connection part between the anisotropic conductive film and the semiconductor element, and in the connection part between the anisotropic conductive film and the circuit board, thereby causing the destruction of the connection interface.

The present invention has been made based on the above finding and is characterized by the following aspects.

(1) A semiconductor device comprising a circuit board, an anisotropic conductive film and a semiconductor element electrically connected to said circuit board via said anisotropic conductive film, wherein the anisotropic conductive film comprises a film substrate made from an insulating resin and plural conductive paths insulated from each other, which paths are disposed in and through the film substrate in the thickness direction, and wherein a gap is formed between the surface on the circuit board side of the film substrate and the board surface of the circuit board.

(2) The semiconductor device of (1) above, wherein the gap has a size of 20–100 $\mu$m.

(3) The semiconductor device of (1) above, wherein at least an end of the conductive path at the position corresponding to the conductor circuit formed on the board surface of the circuit board protrudes from the surface on the circuit board side of the film substrate.

(4) The semiconductor device of (1) above, wherein a solder layer is formed on the conductor circuit formed on the board surface of the circuit board, and the anisotropic conductive film and the circuit board are connected by connecting the solder layer with an end of the conductive path.

According to the semiconductor device of the present invention, the surface on the circuit board side of the film substrate of the anisotropic conductive film and the board surface of the circuit board are not connected (contacted) by the presence of a gap between them. Therefore, the anisotropic conductive film is not affected greatly by the external force caused by the thermal expansion (contraction) of the circuit board. As a result, the stress due to the difference in the coefficient of linear expansion between the semiconductor element and the circuit board decreases, that occurs in the connection part between the anisotropic conductive film and the semiconductor element, as well as the connection part between the anisotropic conductive film and the circuit board, thereby preventing the destruction of the connection interface.

DETAILED DESCRIPTION OF THE INVENTION

The semiconductor device of the present invention is described in detail in the following by referring to Figures.

Figure 1:
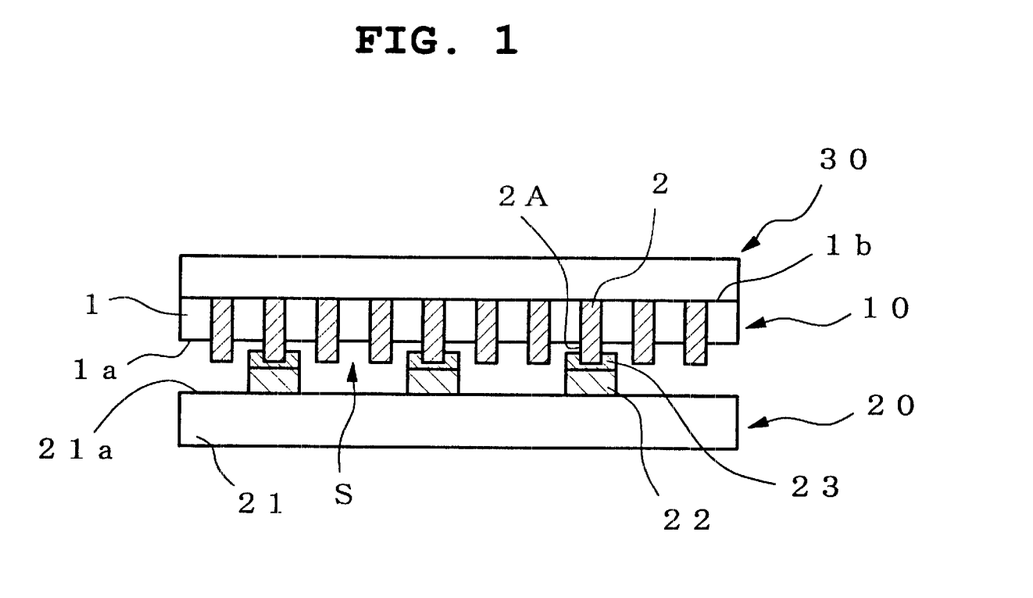
FIG. 1 schematically shows a section of one embodiment of the semiconductor device of the present invention.

FIG. 1 shows one embodiment of the semiconductor device of the present invention. In this semiconductor device, one end 2A of a conductive path 2 protrudes from a surface 1a on a circuit board side of a film substrate 1 of an anisotropic conductive film 10. The protruding end 2A is in contact with a solder layer 23 formed on a conductor circuit (terminal) 22 formed on a board surface 21a of a circuit board 20. A surface 1b on the semiconductor element side of the film substrate 1 is welded to a semiconductor element (chip) 30, wherein the other end of the conductive path 2 does not protrude from the surface 1b on the semiconductor element side of the film substrate 1. The electrode (not shown) of the semiconductor element (chip) 30 is in contact with an end of the conductive path 2 at the surface 1b on the semiconductor element side of the film substrate 1 of the anisotropic conductive film 10.

The conductor circuit (terminal) 22 of the circuit board 20 protrudes from the surface 21a of a board 21. The end 2A of the conductive path 2 which protrudes from the surface 1a of the film substrate 1 of the anisotropic conductive film 10 is in contact with the solder layer 23 formed on the conductor circuit (terminal) 22. A sufficient gap S is formed between the surface 21a of the circuit board 20 and the surface 1a on the circuit board side of the film substrate 1 of the anisotropic conductive film 10. Because of the presence of this gap S, the expansion or shrinkage of the circuit board 20 due to temperature changes is not transmitted directly to the anisotropic conductive film 10. As a result, the external force applied to the anisotropic conductive film 10 becomes small.

Therefore, the stress due to the difference in the coefficient of linear expansion between the semiconductor element 30 and the circuit board 20 decreases, that occurs in the connection part between the anisotropic conductive film 10 and the semiconductor element 30, as well as in the connection part between the anisotropic conductive film 10 and the circuit board 20. Therefore, this connection part stably maintains conductivity without destruction of the interface thereof.

As shown in the above-mentioned FIG. 1, the semiconductor device of the present invention comprises the gap S between the surface 21a of the circuit board 20 and the surface 1a on the circuit board side of the film substrate 1 of the anisotropic conductive film 10. The size of the gap S varies depending on the coefficients of linear expansion of the semiconductor element 30 and the circuit board 20, the material of the film substrate 1 of the anisotropic conductive film 10 and the like. It is generally about 20–100 $\mu$m, preferably about 50–100 $\mu$m.

When the gap S is too large, the strength of the semiconductor device itself against the external force may be lowered. When it is too small, the effect (effect of prevention of destruction of the connection interface) afforded by the gap may become insufficient.

As shown in FIG. 1, the anisotropic conductive film used for the semiconductor device of the present invention comprises the conductive path 2 whose end 2A protrudes from at least the surface 1a on the circuit board side of the film substrate 1. Without the protrusion of the end of the conductive path of the anisotropic conductive film from the surface on the circuit board side of the film substrate, a sufficient gap cannot be secured between the board surface of the circuit board and the surface on the circuit board side of the film substrate, because a typical circuit board comprises a conductor circuit (terminal) having a small protrusion height of generally about 10–50 $\mu$m from the board surface. The protrusion height of the end 2A on the circuit board side of the conductive path 2 of the anisotropic conductive film 10 is generally about 5–100 $\mu$m, preferably about 10–50 $\mu$m.

According to the anisotropic conductive film 10 shown in FIG. 1, all the ends 2A of the conductive paths 2 protrude from the surface 1a on the circuit board side of the film substrate 1. It is also possible to make only the ends of the conductive paths corresponding to the conductor circuit (terminal) of the circuit board protruded from the surface on the circuit board side of the film substrate and the ends of other conductive paths not protrude therefrom.

The end on the semiconductor element side of the conductive path of the anisotropic conductive film may or may not protrude from the surface on the semiconductor element side of the film substrate. This can be appropriately set according to the surface structure of the semiconductor element. For example, the ends on the semiconductor element side of the conductive paths are made to protrude when the semiconductor element is protected with a passivation layer, and the surface of the electrode of the semiconductor element makes a recess from the surface of the passivation layer, because the end on the semiconductor element side of the conductive path cannot maintain the continuity with the electrode unless the end on the semiconductor element side is protruded from the surface on the semiconductor element side of the film substrate. The protrusion height is generally 1–10 $\mu$m, preferably about 1–5 $\mu$m.

The film substrate is made from an adhesive insulating resin. For example, a thermosetting resin, a thermoplastic resin and the like can be used. Examples thereof include polyimide resin, epoxy resin, polyetherimide resin, polyamide resin, phenoxy resin, acrylic resin, polycarbodiimide resin, fluororesin, polyester resin, polyurethane resin, polyamideimide resin and the like, which are selected as appropriate according to the object. These resins may be used alone or in combination. From the aspects of heat resistance and low hygroscopicity, polycarbodiimide resin, polyimide resin and the like are preferable.

The film substrate has a thickness of about 20–200 $\mu$m, particularly about 50–150 $\mu$m, which is preferable for the adhesion to a semiconductor element, conductivity, and shape stability (strength) thereof in a semiconductor device.

The material of the conductive path may be a known conductive one. In consideration of electrical properties, at least one material from good conductor metal materials, such as copper, gold, silver, aluminum, nickel and the like, is preferably used. Copper, gold and nickel are more preferable in view of conductivity.

The material of the conductive path is preferably a good conductor metal material, as mentioned above. Even when the same metal material is used, properties vary, such as conductivity, elastic modulus and the like, depending on the method of forming a conductive path and the like. The conductive path may be obtained by plate-depositing a metal material in a through-hole formed in a film substrate, may be a metal wire penetrating a film substrate to form a conductive path and the like. When a metal wire is used, for example, a metal conductor wire produced to conduct electricity, such as a copper wire defined in JIS C3101, 3103 and the like, is preferable, because it makes a most superior conductive path in terms of electric properties, mechanical properties and cost.

As shown in an exemplary production method of the anisotropic conductive film to be mentioned later, the part penetrating the film substrate of the conductive path and the end protruded from the circuit board side/semiconductor element side surface of the film substrate may be made from different metal materials or may be made by different methods (combination of metal wire and plating and the like).

The shape of the section of the conductive path (section perpendicular to the conducting direction) is free of any particular limitation and may be circular, various polygons, deformed shapes and the like. For the closest packing of the paths while securing insulation from each other and easy production of high quality products, a circular section is preferable. The size of the section of the conductive path in the case of a circle is preferably about 5–100 μm in diameter for superior contact with an electrode of the semiconductor element. When a metal conductor wire is used as a conductive path, therefore, it has a wire diameter of 5–100 μm. When a conductive path has a sectional shape other than a circle, the section preferably corresponds to the area of a circle having a diameter of 5–100 μm. About 2 to 10 conductive paths preferably correspond to one electrode of the semiconductor element. To achieve this number, the size of the section of the above-mentioned conductive paths and the number of conductive paths per unit area are determined. In general, the number of conductive paths per unit area of the film substrate surface is about 50–2000 paths/mm$^2$.

Figure 2A:
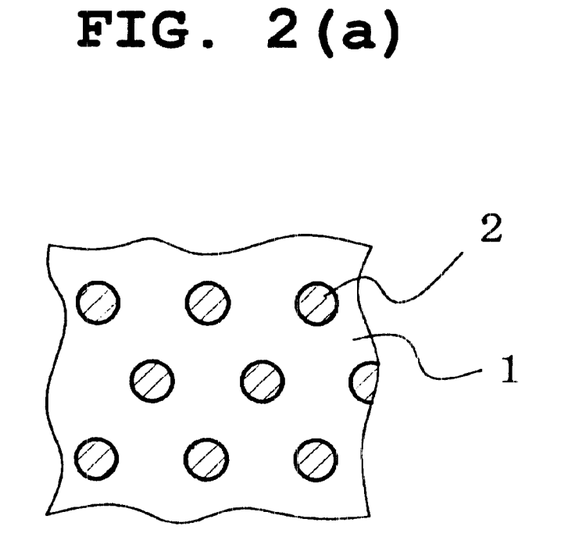
FIG. 2 shows an arrangement pattern of the conductive paths in the anisotropic conductive film used in the present invention.
Figure 2B:
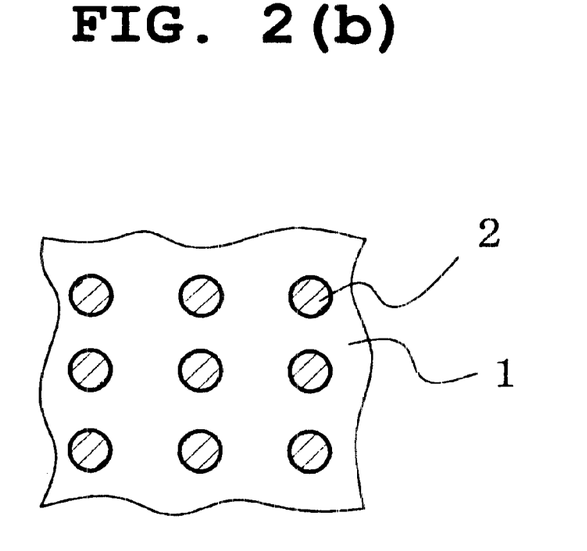

The collective state of the conductive paths 2 in the film substrate 1, i.e., the pattern of conductive paths 2 seen from the film surface may be the closest packed state as shown in FIG. 2(a), a square matrix as shown in FIG. 2(b) or a different random collective state. To correspond to fine electrodes of a semiconductor element, the state near the closest packed state is preferable.

Figure 3:
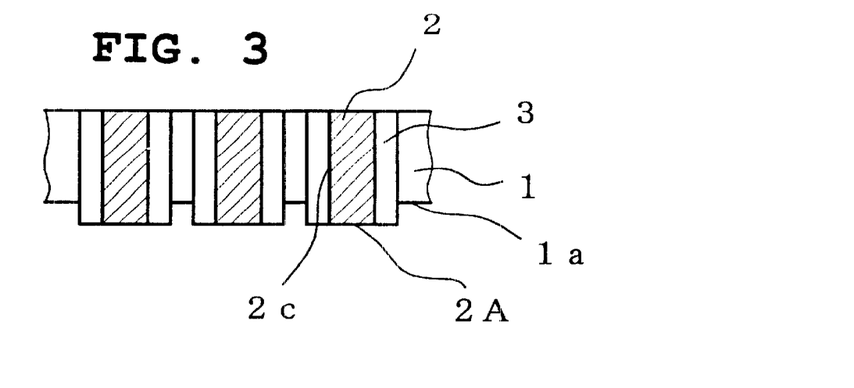
FIG. 3 schematically shows a section of another embodiment of the anisotropic conductive film to be used in the present invention.

In the embodiment of FIG. 1, the end 2A of the conductive path 2 alone protrudes from the surface 1a of the film substrate 1. As shown in FIG. 3, a surface 2c on the body of a conductive path 2 is covered with a coating layer 3 made from a coating resin, and an end 2A of the conductive path 2 may protrude from a surface 1a of a film substrate 1. By this mode, the conductive path 2 is reinforced from the periphery by the coating layer 3, while protruding from the surface 1a of the film substrate 1. As a consequence, the strength of the connection part between the anisotropic conductive film and the circuit board (connection part between the end of the conductive path and the conductor circuit (terminal) of the circuit board) increases, which in turn increases the strength of the semiconductor device against an external force. The thickness of the coating layer 3 is generally about 0.1–5 μm, preferably about 0.5–2 μm. The coating resin is selected from the same resin materials as used for the insulating resins of the film substrate, in view of the reinforcement of the end of the conductive path.

The end surface of the conductive path may be flat as shown in FIG. 1 and FIG. 3, a hemisphere known as a typical shape of a bump contact, or a recess. The shape is selected as appropriate according to the shape of the surface of an electrode of a semiconductor element and the shape of the surface of a conductor circuit (terminal) of a circuit board.

An anisotropic conductive film wherein at least the end on a circuit board side of the conductive path protrudes from the surface on the circuit board side of the film substrate can be produced by, for example, the following method.

Figure 4A:
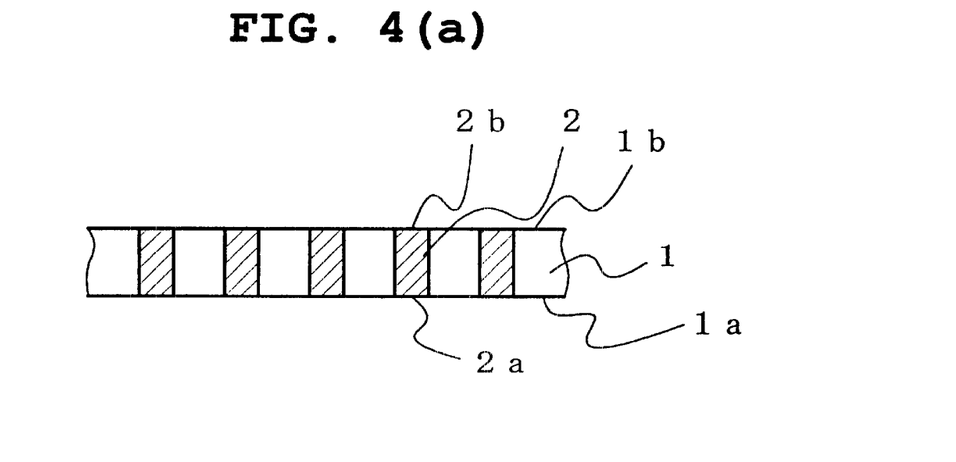
FIG. 4 shows one embodiment of the production of the anisotropic conductive film to be used in the present invention.

First, end surfaces 2a, 2b of the conductive path 2 are exposed on the both surfaces 1a, 1b of the film substrate 1 (anisotropic conductive film wherein end surfaces 2a, 2b of conductive path 2 and end surfaces 1a, 1b of the film substrate 1 are on the same surface) (FIG. 4(a)). Then, by plating or metal deposition by vapor deposition on the end surface 2a of the conductive path 2 exposed on one surface (surface on the circuit board side) 1a of the film substrate 1, the end 2A of a conductive path protruding from the surface 1a of the film substrate 1 (FIG. 4(b)) is formed.

If necessary, by plating or metal deposition by vapor deposition on the end surface 2b of conductive path 2 exposed on the other surface (surface on the semiconductor element side) 1b of film substrate 1, the end of the conductive path protruding from the surface 1b of the film substrate can be formed.

To obtain a film wherein the end surfaces 2a, 2b of the conductive path 2 exposed on the surfaces 1a, 1b of the film substrate 1 of FIG. 4(a) (anisotropic conductive film wherein end surfaces 2a, 2b of conductive path 2 and end surfaces 1a, 1b of film substrate 1 are on the same surface), the film substrate 1 is perforated and the through-hole is plated with a metal material, or a metal material is coated on the surface of the inner walls of the holes, or a number of insulated wires (metal wires coated with insulating resin layer) are densely packed, where the coating layers are inseparably bonded to each other, and the pack of the wires is sliced in a desired thickness in the direction forming an angle with the insulated wires, to give a film having a desired thickness (reference may be made to WO98/07216 entitled "Anisotropic conductive film and process thereof" for the technique necessary for this method).

In the above-mentioned embodiment, the end 2A of the conductive path 2 is formed by metal plating or vapor deposition. It is also possible to form the end 2A of the conductive path 2 by subjecting a film wherein the end surfaces 2a, 2b of the conductive path 2 exposed on the surfaces 1a, 1b of the film substrate 1 of FIG. 4(a) (anisotropic conductive film wherein end surfaces 2a, 2b of conductive path 2 and end surfaces 1a, 1b of film substrate 1 are on the same surface) to an etching capable of removing only the film substrate 1. The etching method may be wet etching, dry etching such as plasma etching, argon ion laser, KrF excimer laser and the like, and the like, which may be used alone or in combination. The etchant for the wet etching is determined in consideration of the material of the film substrate, the material of the conductive path and the like. For example, dimethylacetamide, dioxane, tetrahydrofuran, methylene chloride and the like can be used.

Figure 4B:
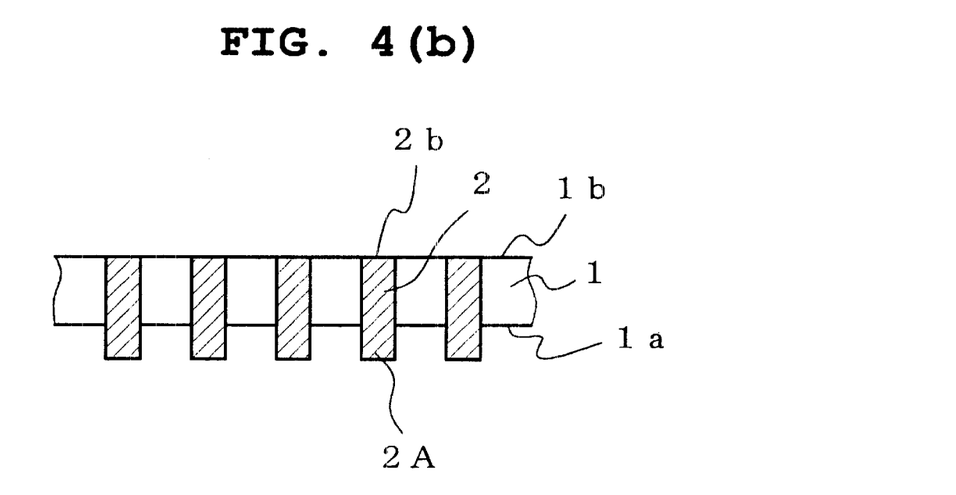

When the end of a conductive path corresponding to the conductor circuit (terminal) of the circuit board is protruded from the surface on the circuit board side of the film substrate and the ends of other conductive paths are not protruded from the surface on the circuit board side of the film substrate, in the aforementioned step of FIG. 4(b), the end surfaces of other conductive paths other than the conductive path corresponding to the conductor circuit (terminal) of the circuit board are masked during the metal plating or vapor deposition. Alternatively, all the ends of the conductive paths are protruded and the protruding ends of the conductive paths other than the conductive path corresponding to the conductor circuit (terminal) of the circuit board are cut off.

When the anisotropic conductive film is prepared in the mode shown in FIG. 3, a method including the following steps 1 to 4 is preferably employed.

1. One or more coating layers made from a coating resin are formed on the surface of a metal conductor wire, and one or more layers of an insulating resin, which become a film substrate, are formed thereon to give an insulated wire, which is then wound around a core.
2. The resulting coil is heated and/or pressurized to integrally weld and/or compression-bond the resin layers of the insulated wire to give a coil block.
3. The obtained coil block is sliced in a desired thickness in the direction forming an angle (generally perpendicular) with the insulated wires to give a film.
4. The film obtained in 3. is selectively etched to remove the insulating resin alone.

In this method, the insulating resin to be a film substrate and the coating resin to be a coating layer should allow selective etching of each other. The selective etching of each other ideally means that etching of one member does not lead to the etching of the other. However, it is only required that the etching rates of the two resins not be the same.

The etching method affording the selectivity may be, for example, etching with an organic solvent such as cresol and the like, etching with an alkaline solution such as sodium hydroxide solution and the like, plasma etching, laser etching and the like. The combination of the resins capable of selective plasma etching of each other (insulating resin/coating resin of film substrate) is, for example, (polyester resin/polyethersulfone resin), (polyamide resin/polyamideimide resin) and the like.

The semiconductor element (chip) constituting the semiconductor device of the present invention is not particularly limited, but may be a semiconductor element (inclusive of IC (integrated circuits)) prepared by forming a desired element structure on a semiconductor substrate, such as a typical silicon substrate, a GaAs substrate and the like.

The circuit board is not particularly limited, either, and may be a typical circuit board for mounting a semiconductor, which is prepared by forming a conductor circuit (inclusive of terminal) having a thickness of about 10–50 µm, which is made from a good conductor metal material such as copper, gold, silver, aluminum and the like, on the surface of a board made from an insulating material, such as a conventional glass epoxy board and the like.

A typical semiconductor element and a circuit board have a coefficient of linear expansion of generally $2.6 \times 10^{-6}$–$3.6 \times 10^{-6}$/° C. for the semiconductor element and generally $20 \times 10^{-6}$–$25 \times 10^{-6}$/° C. for the circuit board, though subject to variation depending on the constituent materials, structures and the like, thus showing about one order difference between them. With regard to the semiconductor device of the present invention, the semiconductor element and the circuit board may show such a difference in the coefficient of linear expansion. This is because a stress due to the difference in the coefficient of linear expansion between the semiconductor element and the circuit board, that occurs in the connection part between the anisotropic conductive film 10 and the semiconductor element 30, as well as in the connection part between the anisotropic conductive film 10 and the circuit board 20, decreases to a sufficient low level and the destruction of the connection interface can be prevented.

The production method of the semiconductor device of the present invention is not particularly limited. Generally, one surface of an anisotropic conductive film is connected to a semiconductor element and the other surface is connected to a circuit board.

An anisotropic conductive film and a semiconductor element are connected by heating with or without pressurizing. The connection between the semiconductor element and the anisotropic conductive film may be established by welding the film substrate to the surface of the semiconductor element (electrode and conductive path may be a mere contact), an electrode may be welded to a conductive path and the bonding force may be utilized to keep the two bonded, or these methods may be combined.

The heating temperature is generally 150–400° C., preferably 200–350° C. When a pressure is applied, it is generally 0.49–3.9 MPa, preferably 0.49–2.9 MPa.

FIG. 1 shows one completed semiconductor device (one anisotropic conductive film 10 is welded to one semiconductor element 30). From the aspect of the productivity of the semiconductor device, an anisotropic conductive film having a greater surface area than the area of a semiconductor wafer carrying semiconductor elements set in given plural sections is preferably bonded to the plural semiconductor elements, and the resulting structure is cut into each element to give a chip with an anisotropic conductive film.

In this case, the semiconductor wafer and the anisotropic conductive film are bonded by pressing and heating. For this end, a preferable apparatus may be an autoclave. It is also possible to combine a known pressing apparatus and a heater to give a desired production apparatus. The heating temperature can be one capable of bonding a semiconductor wafer and an anisotropic conductive film. Utilizing the heat adhesiveness of the anisotropic conductive film, a preferable temperature is, for example, 140–220° C., particularly 150–200° C.

An anisotropic conductive film and a circuit board can be connected as shown in the aforementioned FIG. 1. That is, a solder layer 23 is formed on a conductor circuit (terminal) 22 of a circuit board 20, and, for example, using a known surface mount technology (SMT), the end 2A of the conductive path 2 protruding from the surface 1a on the circuit board side of the film substrate 1 of the anisotropic conductive film 10 is bonded to the solder layer 23, thereby bonding the end 2A of the conductive path 2 to the conductor circuit (terminal) 22.

The conductor circuit (terminal) of the circuit board and the end of the conductive path can be bonded using a layer of a material other than solder. The material may be any as long as it shows good conductivity and can be used for the bonding of a conductor circuit (terminal) and a conductive path.

The material layer capable of bonding the conductor circuit (terminal) and the conductive path has a thickness of, for example, generally 10–50 µm, preferably 2–10 µm, in the case of a solder layer. In the case of a material other than solder, the same thickness generally applies.

The present invention is explained in more detail in the following by referring to Examples and Comparative Examples, which do not limit the present invention.

EXAMPLE 1

A structure was prepared, which comprised a film substrate made from a polycarbodiimide resin, and plural copper wires having a diameter of 80 μm, which wires being insulated from each other and penetrating the film substrate in the thickness direction.

Then, the end surface of a copper wire exposed on the surface on the semiconductor element side of the film substrate (surface on the side where semiconductor element was attached) of the above-mentioned structure was subjected to electroless Ni/Au plating to prepare a terminal (the end of the conductive path) protruding 3 μm from the surface on the semiconductor element side of the film substrate. Similarly, the end surface of the copper wire exposed on the surface on the circuit board side of the film substrate (surface on the side where circuit board was attached) was subjected to electroless Ni/Au plating to make the terminal (the end of conductive path) protrude 3 μm from the surface on the circuit board side of the film substrate. The surface on the circuit board side of the film substrate was plasma etched to complete an anisotropic conductive film of the following size construction.

Entire size of the film: 10 mm×10 mm
Thickness of the film substrate: 100 μm
Diameter of the conductive path: 80 μm
Pitch of the conductive path: 100 μm
Protrusion height of the end of the conductive path on the circuit board side: 70 μm A semiconductor chip (substrate material:Si, electrode material:Al, chip size: 10 mm×10 mm, thickness 525 μm) and a circuit board (board material:glass epoxy board (FR-4), conductor circuit material:Cu, Ni/Au plated wire, terminal size:0.2 mm×0.2 mm, terminal thickness:35 μm) were prepared and a soldering paste (thickness 5 μm) was printed on the conductor circuit (terminal) on the circuit board.

The semiconductor chip and the anisotropic conductive film were heated and pressurized at 300° C., 1.96 MPa to connect the surface on the semiconductor element side of the film substrate of the anisotropic conductive film to the semiconductor chip, thereby affording a chip with an anisotropic conductive film. This was mounted on the circuit board such that the board surface on the circuit board side of the film substrate of the anisotropic conductive film and the board surface of the circuit board faced each other. The resulting structure was heated in a reflow furnace at 185° C. to melt the solder, whereby the end of the conductive path and the solder were welded. In the semiconductor device thus obtained, the gap between the surface on the circuit board side of the film substrate of the anisotropic conductive film and the board surface of the circuit board was 100 μm.

Using this semiconductor device, target cycle time (TCT; −55° C. −125° C., each 30 min) was performed. As a result, a continuity failure did not occur even after 1000 cycles.

EXAMPLE 2

In the same manner as in Example 1 and using a copper wire having a diameter of 50 μm, an anisotropic conductive film having the following size construction was completed.

Entire size of the film: 10 mm×10 mm
Thickness of the film substrate: 50 μm
Diameter of the conductive path: 50 μm
Pitch of the conductive path: 70 μm
Protrusion height of the end of the conductive path on the circuit board side :30 μm A semiconductor chip and a circuit board similar to those in Example 1 were prepared and a soldering paste (thickness 10 μm) was printed on the conductor circuit (terminal) of the circuit board.

The semiconductor chip and the anisotropic conductive film were heated and pressurized at 250° C., 2.94 MPa to connect the surface on the semiconductor element side of the film substrate of the anisotropic conductive film to the semiconductor chip, thereby affording a chip with an anisotropic conductive film. This was mounted on the circuit board such that the board surface on the circuit board side of the film substrate of the anisotropic conductive film and the board surface of the circuit board faced each other. The resulting structure was heated in a reflow furnace at 185° C. to melt the solder, whereby the end of the conductive path and the solder were welded. In the semiconductor device thus obtained, the gap between the surface on the circuit board side of the film substrate of the anisotropic conductive film and the board surface of the circuit board was 60 μm.

Using this semiconductor device, TCT (−55° C. −125° C., each 30 min) was performed. As a result, a continuity failure did not occur even after 1000 cycles.

EXAMPLE 3

In the same manner as in Example 1 and using a copper wire having a diameter of 50 μm, an anisotropic conductive film having the following size construction was completed.

Entire size of the film: 10 mm×10 mm
Thickness of the film substrate: 50 μm
Diameter of the conductive path: 50 μm
Pitch of the conductive path: 70 μm
Protrusion height of the end of the conductive path on the circuit board side: 5 μm A semiconductor chip similar to that used in Example 1 and a circuit board (board material:glass epoxy board (FR-4), conductor circuit material:Cu, Ni/Au plated wire, terminal size: 0.2 mm×0.2 mm, terminal thickness: 15 μm) were prepared and a soldering paste (thickness 5 μm) was printed on the conductor circuit (terminal) on the circuit board.

The semiconductor chip and the anisotropic conductive film were heated and pressurized at 220° C., 0.98 MPa to connect the surface on the semiconductor element side of the film substrate of the anisotropic conductive film to the semiconductor chip, thereby affording a chip with an anisotropic conductive film. This was mounted on the circuit board such that the surface on the circuit board side of the film substrate of the anisotropic conductive film and the board surface of the circuit board faced each other. The resulting structure was heated in a reflow furnace at 185° C. to melt the solder, whereby the end of the conductive path and the solder were welded. In the semiconductor device thus obtained, the gap between the surface on the circuit board side of the film substrate of the anisotropic conductive film and the board surface of the circuit board was 20 μm.

Using this semiconductor device, TCT (−55° C. −125° C., each 30 min) was performed. As a result, a continuity failure did not occur even after 800 cycles.

Comparative Example 1

In the same manner as in Example 1 except that plasma etching was not applied in the final production step of the anisotropic conductive film, a semiconductor device was prepared. However, a part of the film substrate of the anisotropic conductive film melted during a step for connecting the end of the conductive path and a solder, and the polycarbodiimide resin melt resulting therefrom filled the small gap between the surface on the circuit board side of the film substrate of the anisotropic conductive film and the board surface of the circuit board (gap: 0 μm). Using this semiconductor device, TCT (−55° C. −125° C., each 30 min) was performed. As a result, a continuity failure occurred after 300 cycles.

As is evident from the foregoing explanation, the semiconductor device of the present invention has a gap between the surface on the circuit board side of the film substrate of an anisotropic conductive film and the board surface of a circuit board, as a result of which the connection part between the anisotropic conductive film and the circuit board, as well as the connection part between the anisotropic conductive film and the semiconductor element do not suffer from interface destruction, even when the device is used in an environment associated with drastic temperature changes. Thus, a semiconductor device having high connection reliability can be obtained.

This application is based on application Nos. 033550/2000 filed in Japan, the contents of which are incorporated hereinto by reference.

What is claimed is:

1. A semiconductor device comprising a circuit board, an anisotropic conductive film and a semiconductor element, wherein the semiconductor element is mounted on the circuit board via the anisotropic conductive film, such that the semiconductor element is electrically connected to said circuit board, and wherein the anisotropic conductive film comprises a film substrate made from an insulating resin and plural conductive paths insulated from each other and disposed in and through the film substrate in the thickness direction, and wherein a gap is formed between the surface on the circuit board side of the film substrate and the board surface of the circuit board.

2. The semiconductor device of claim 1, wherein the gap has a size of 20–100 $\mu$m.

3. The semiconductor device of claim 1, wherein at least an end of the conductive path at the position corresponding to the conductor circuit from the surface on the circuit board side of the film substrate.

4. The semiconductor device of claim 1, wherein a solder layer is formed on the conducotor circuit formed in the board surface of the circuit board, and the anisotropic conductive film and the circuit board are connected by connecting the solder layer with an end of the conductive path.

* * * * *

UNITED STATES PATENT AND TRADEMARK OFFICE
CERTIFICATE OF CORRECTION

PATENT NO. : 6,667,542 B2
DATED : December 23, 2003
INVENTOR(S) : Yamaguchi et al.

It is certified that error appears in the above-identified patent and that said Letters Patent is hereby corrected as shown below:

Column 12,
Line 14, "circuit from" should read -- circuit formed on the board surface of the circuit board protudes from --.
Line 17, "conducotor." should read -- conductor --.

Signed and Sealed this

Twenty-ninth Day of June, 2004

JON W. DUDAS
*Acting Director of the United States Patent and Trademark Office*